US005874838A

United States Patent [19]
Rees

[11] Patent Number: 5,874,838
[45] Date of Patent: Feb. 23, 1999

[54] HIGH VOLTAGE-TOLERANT LOW VOLTAGE INPUT/OUTPUT CELL

[75] Inventor: David B. Rees, Hants, United Kingdom

[73] Assignee: Cypress Semiconductor Corporation, San Jose, Calif.

[21] Appl. No.: 664,061

[22] Filed: Jun. 13, 1996

[51] Int. Cl.$^6$ .................... H03K 19/0175; H03K 19/094
[52] U.S. Cl. .................. 326/86; 326/83; 326/81
[58] Field of Search .................. 326/83, 86, 80, 326/81, 121, 58, 21

[56] References Cited

U.S. PATENT DOCUMENTS

| | | | |
|---|---|---|---|
| 5,057,715 | 10/1991 | Larsen et aL. | 326/83 |
| 5,150,186 | 9/1992 | Pinney et al. | 326/112 |
| 5,319,259 | 6/1994 | Merrill | 326/21 |
| 5,565,794 | 10/1996 | Porter | 326/81 |

Primary Examiner—Edward P. Westin
Assistant Examiner—Richard Roseen
Attorney, Agent, or Firm—Maiorana & Acosta, P.C.

[57] ABSTRACT

An improved I/O cell is disclosed which includes a combined p-channel and n-channel transistor pullup configuration. In particular, such combination is connected in series between the chip operating voltage $V_{cc}$, and the I/O cell output pad. The n-channel transistor is biased substantially continuously on its gate terminal with a pumped voltage from a charge pump, which permits it to pass voltages up to and including $V_{cc}$. The p-channel transistor operates in its normal fashion, controllable via a pullup select signal applied to its gate terminal to pull the pad high. During normal operation, the n-channel transistor is always ON, thus reducing the substantial dynamic current drawn from the charge pump. The voltage appearing on the pad is fed back to a second n-channel transistor. When the voltage on the pad exceeds $V_{cc}$ for example, a 5 volt signal when $V_{cc}$ is 3.3 volts), the second n-channel transistor switches the gate of the first n-channel transistor to a reference signal, which is a diode drop below $V_{cc}$. The first n-channel transistor, in response thereto, shuts-off, thus protecting the p-channel pullup transistor from the excessive voltages appearing on the pad.

17 Claims, 2 Drawing Sheets

HIGH VOLTAGE-TOLERANT LOW VOLTAGE INPUT/OUTPUT CELL

BACKGROUND OF THE INVENTION

1. Field of the Invention

The present invention relates generally to interface structures connected to a pad of a semiconductor device, and, in particular, to an input/output cell tolerant to high voltages applied to the pad.

2. Description of the Related Art

With the advancement of microelectronic devices, due in part to shrinking geometries, and the need for reduced power dissipation, a 3.3 volt operating voltage standard has emerged as an alternate standard to the ubiquitous 5 volt standard that has existed for many years. In a mixed operating voltage environment where both a 5 volt rail and a 3 volt rail exist, a 5 volt signal may be applied to a pin designed for 3 volts. This application of a relatively high voltage to a low voltage pin may occur by design, such as where 3.3 volt devices, as well as 5 volt devices share a common bus, or, alternatively, unintentionally, such as may occur during "live insertion," or, by other accident wherein a 5 volt signal is cross-connected to such a low voltage pin. The above-referenced "high" voltage may be defined as any voltage level that is greater than the $V_{cc}$/operating voltage of the device.

Thus, designers of such microelectronic devices, and, in particular, the designers of interface structures, such as input/output (I/O) cells employed in such devices, have remained cognizant of such high voltage applications to low voltage pins.

One problem arising in view of the foregoing relates to the "pullup" circuit portion of the I/O cell. In particular, the specific problem relates to the use of a p-channel FET as the pullup device on a 3.3 volt operating voltage device when a relatively higher voltage, such as a 5.0 volt signal, is applied to the pin of such a device. Consider that the pullup p-channel transistor is formed in an n-well, which may be tied to $V_{cc}$ (e.g., 3.3 volts for a 3.3 volt part). When a 5 volt signal appears on the I/O pad, it is coupled to the drain $p_+$ region of the pullup p-channel transistor. Large currents flow when this situation occurs for two reasons. First, a p-n junction, formed by the source/drain $p^+$ and the n-well region, will be forward biased and will conduct a significant amount of current. Second, the p-channel pullup device itself may be turned "ON," since the gate voltage (which will have, at most, $V_{cc}$ applied thereto) will be lower than the drain terminal (connected to the I/O pad) by more than the device threshold level wherein the transistor conducts, thus shorting the high voltage on the output pad to the internal power supply rail (3.3 volt rail).

For 5 volt devices, conventional I/O cell designs have used an n-channel field effect transistor (FET) as the "pullup" transistor so the above problem does not occur. This design choice is acceptable for 5 volt devices since the pad, which is connected to the I/O cell, need not be pulled all the way up to 5 volts in most applications; that is, the reduction in output potential relative to $V_{cc}$ due to the requirement that $V_{gs} > V_{tn}$ of the n-channel device used as a pullup device to keep it "on" still provides a high enough output voltage to define a logic high output state (i.e., $V_{OH}$). However, with respect to 3.3 volt devices, the limitations of the n-channel device are unacceptable. In particular, the lowered output relative to the 3.3 volt $V_{cc}$ does not permit the I/O cell to drive the output pad to a high enough level to meet most $V_{OH}$ requirements.

Thus, it would be desirable to use a p-channel device as the "pullup" device for 3.3 volt parts but the above-described problems relating to high voltages (e.g., 5 volts) applied to low voltage (3.3 volt) I/O cells have circumscribed its use in the 3.3 volt environment for some applications.

One solution taken by the art in solving the above problems is to use a pumped n-channel pullup device for 3.3 volt devices wherein a high voltage gate drive signal, derived from a charge pump, is used to provide a full-rail swing to 3.3 volts on the output pad. A problem with this approach, however, is that a substantial dynamic current is required from the charge pump circuit to raise the n-channel transistor gate sufficiently above $V_{cc}$ so that the input/output pad can be pulled all the way to $V_{cc}$. Some current is also required even when the pullup transistor is not switching to combat leakage so that a static current ($I_{cc}$) drawn by such a microelectronic device may be relatively large— sometimes unacceptably large for a chip that is supposed to draw very few microamps when it is not switching.

Accordingly, there is a need to provide an I/O cell structure that minimizes or eliminates one or more of the problems as described above.

SUMMARY OF THE INVENTION

An interface structure according to the present invention is suitably adapted to be connected to a pad of a semiconductor device, and provides tolerance to high voltages (i.e., higher than the chip $V_{cc}$) applied to I/O pins thereof, while providing full-rail swing when operating at low voltages, such as, in a preferred embodiment, 3.3 volts.

To achieve this feature as well as other features and advantages, a combined p-channel transistor and n-channel transistor pullup structure is provided. The p-channel pullup transistor is connected to a first power supply producing a first voltage, 3.3 volts in one embodiment. The p-channel transistor includes a gate terminal responsive to a pullup select signal for selectively pulling the pad high all the way to $V_{cc}$. The n-channel transistor is connected in series between the p-channel transistor and the I/O pad. The n-channel transistor includes a gate terminal connected to a pumped voltage rail producing a second voltage level higher than $V_{cc}$ so that the n-channel will effectively pass full swing $V_{cc}$. The n-channel is always "ON" during normal operation (i.e., when the pad voltage level on the pad is at or below $V_{cc}$), thus eliminating the substantial dynamic current from the charge pump associated with conventional designs. The interface structure according to the invention further includes means for placing the n-channel transistor in a non-conductive mode when the pad voltage exceeds $V_{cc}$. When the n-channel transistor is non-conductive, it isolates the pullup p-channel transistor from the high voltages appearing on the pad whereby the p-channel transistor, and the interface structure itself, is protected from high currents. The extent to which the pullup n-channel transistor must be made non-conductive depends on the $V_T$ of the transistor, the level of the pumped voltage normally on its gate, and the amount of leakage from the pad which can be tolerated.

In another aspect of this invention, a logic device including the inventive interface structure is provided. Such a logic device may comprise, in various embodiments, a binary counter, a transceiver, a multiplexer, a register, a latch, and/or a buffer of various bit-widths. Or, indeed, any type of chip whatever its function.

In yet another aspect of this invention, a method of operating an interface structure is provided. Such structure is of the type suitable for use in a semiconductor device having such structure connected to a pad. Such a method is suitably employed where the interface structure includes a pullup p-channel transistor connected to a first power supply producing a first voltage, which, in one embodiment, is the system operating voltage $V_{cc}$ of 3.3 volts, and, in addition, includes an n-channel transistor connected in series between the p-channel transistor and the pad. The method involves two basic steps. The first step involves biasing the n-channel transistor to conduct in such a way that the pullup p-channel transistor can pull the pad high all the way to $V_{cc}$. The second step involves varying the biasing step when a pad voltage level on the pad exceeds the system voltage $V_{cc}$ to diminish the conductivity of the n-channel FET. This isolates the pullup p-channel transistor from the pad so that the pullup p-channel transistor is protected from undesirable, large currents when such high voltages are present on the pad.

Other objects, features and advantages of the present invention will become apparent to one skilled in the art from the following detailed description and the accompanying drawings illustrating features of this invention by way of example, but not by way of limitation.

DETAILED DESCRIPTION OF THE PREFERRED EMBODIMENTS

Figure 1:
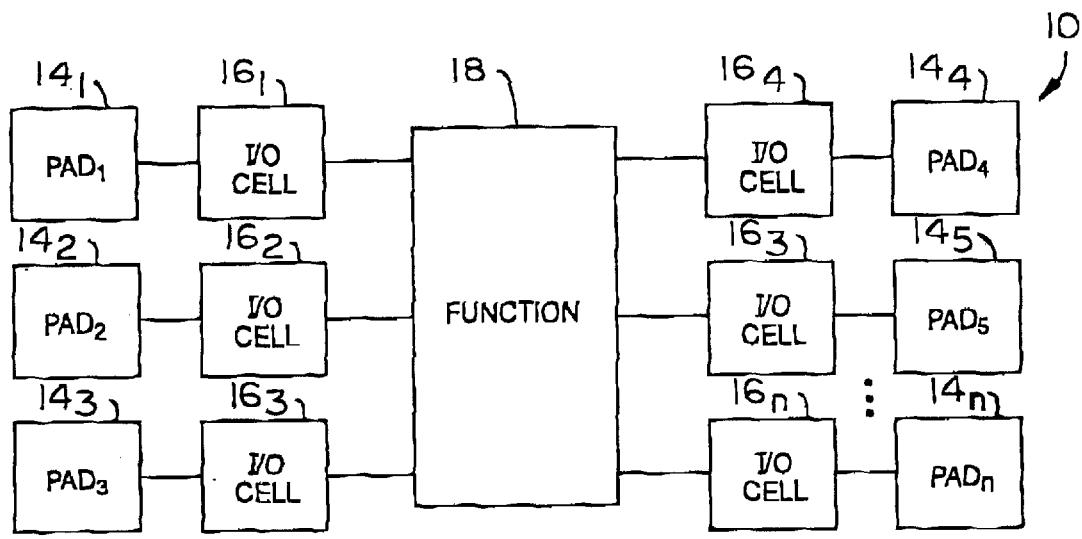
FIG. 1 is a simplified block diagram illustrating a preferred embodiment of the present invention, including an I/O cell.

Referring now to the drawings wherein like reference numerals are used to identify identical components in the various views, FIG. 1 shows a semiconductor device 10 fabricated in accordance with the present invention. Device 10 includes a semiconductor die or body portion 12, containing various structures fabricated therein, such as a plurality of pads $14_1, 14_2, \ldots, 14_n$ connected to a corresponding plurality of input/output (I/O) cells $16_1, 16_2, \ldots, 16_n$, and a function block 18.

As is well-known, each pad $14_i$ is provided for connecting to a corresponding conductor (e.g., pin) disposed in a semiconductor package, and for interfacing with signals external to semiconductor body 12 (e.g., a bus or backplane connected to other devices, some of which may be 5 volt devices, others 3.3 volt devices).

Each I/O cell $16_i$ is provided for driving the potential on a corresponding pad $14_i$ to a logic high level, a logic low level, or, to a high impedance state (i.e., tri-state), in the case of an output function. In the case of an input function, such I/O cells provide input buffering, and level translation (as required). Thus, it should be appreciated that the connections between respective pads, and I/O cells 16 may be bi-directional.

Function block 18 is responsive to one or more input signals from selected ones of the I/O cell $16_i$ for performing a function using these input signals, and, for providing an output signal to a selected one(s) of the I/O cells for output on the corresponding pad $14_i$. Function block 18 may take many forms, as required, in order to accomplish the overall function of device 10. For example, and not by way of limitation, device 10 may comprise such devices as a registered transceiver, a pipeline register, a scan register, a decoder, a multiplexer, a counter, a line driver, a buffer, a latch, an interface register, a parity generator/checker and/or a memory. A device 10 according to the present invention includes at least one I/O cell $16_i$ in accordance with the present invention, the details of which to be set forth hereinafter.

Figure 2:
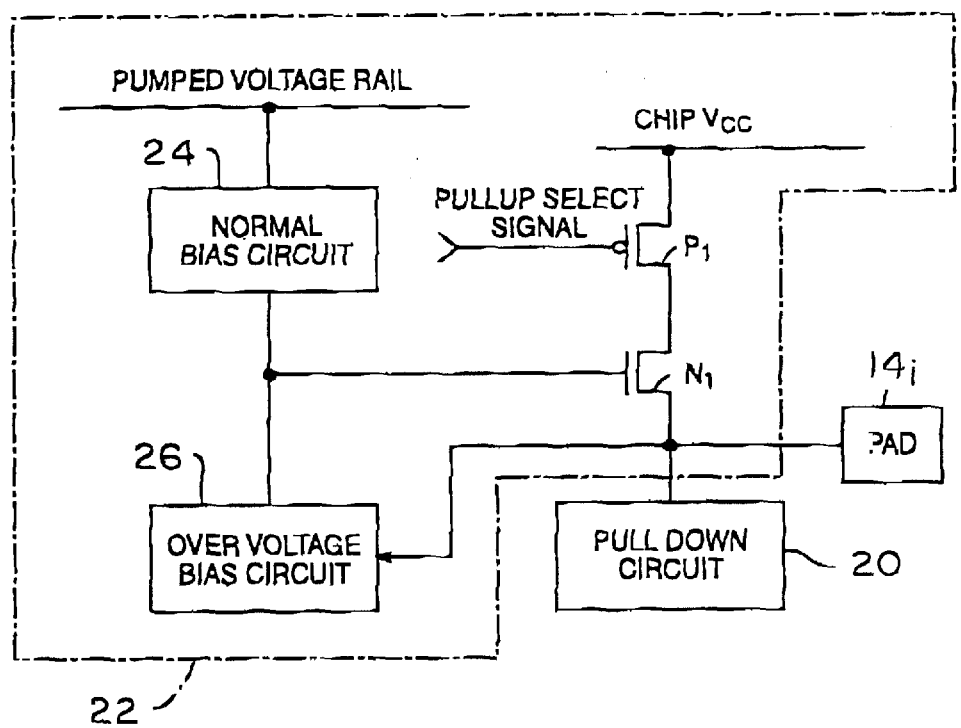
FIG. 2 is a simplified block and schematic diagram illustrating a preferred pullup structure of the present invention.

FIG. 2 shows one embodiment of an improved I/O cell interface structure $16_i$. The improved I/O cell $16_i$ comprises a pulldown circuit 20, and a pullup circuit 22.

Pulldown circuitry 20, depicted in block diagram form in FIG. 2, is coupled between pad $14_i$, and a ground node having a ground potential, and is provided for pulling the voltage level appearing on pad $14_i$ to ground potential. Pulldown circuitry 20 may take any one of a plurality of forms well-known and conventional in the art, and may comprise, in one embodiment, an n-channel field effect transistor (FET) (not shown), appropriately sized for predetermined, output voltage, and current sinking specifications. For example, such n-channel FET may comprise a plurality of n-channel FETs (not shown) arranged in parallel.

Pullup circuit 22 is provided for pulling pad $14_i$ to a logic high state, which may be substantially equal to the device operating voltage $V_{cc}$, and may be 3.3 volts in a preferred embodiment. Circuit 22 includes a pullup p-channel FET $P_1$, a pullup n-channel FET $N_1$, a normal bias circuit 24, and an over voltage bias circuit 26.

Pullup p-channel transistor P1 is connected to power supply rail $V_{cc}$, which, in a preferred embodiment, may be 3.3 volts, and is provided with a gate terminal responsive to a pullup select signal for selectively pulling pad $14_i$ all the way to $V_{cc}$. $P_1$ may be implemented using a plurality of transistors connected in parallel (as in the pulldown device). The pullup select signal controls the output level on pad $14_i$ by selectively causing $P_1$ to become conductive, or non-conductive, depending on its state. This function, and needed input and the resulting output signals levels are well-known.

N-channel transistor $N_1$ is connected in series between transistor $V_{cc}$, and pad $14_i$, and, together with $P_1$, form a combined p-channel and n-channel transistor pullup channel. Transistor $N_1$ is provided with a gate terminal which is biased by circuits 24 and 26 as a function of the voltage pad $14_i$, to be described in further detail hereinafter.

Normal bias circuit 24 functions to apply a "pumped" voltage to the gate terminal of $N_1$ when the pad voltage on pad $14_i$ is in a "normal" range (i.e., no over voltage on the pad $14_i$—such as when the pad voltage exceeds $V_{cc}$). The pumped voltage has a magnitude that is at least a threshold $V_{tn}$ higher than the system operating voltage $V_{cc}$. This biasing permits, as should be appreciated by those of ordinary skill in the art, passage of a voltage level $V_{cc}$ between source and drain terminals of device $N_1$. Transistor $N_1$, so biased, thus operates as "pass" gate.

Over voltage bias circuit 26 is provided to vary the biasing produced by circuit 24 so as to not permit conduction by $N_1$ when the pad voltage exceeds $V_{cc}$ (i.e., an "OVER VOLTAGE" condition). This function of biasing $N_1$ so as to be substantially non-conductive isolates $P_1$ from over voltages on the pad $14_i$, thus protecting it from the accompanying high currents that would otherwise accompany such high voltages.

Figure 3:
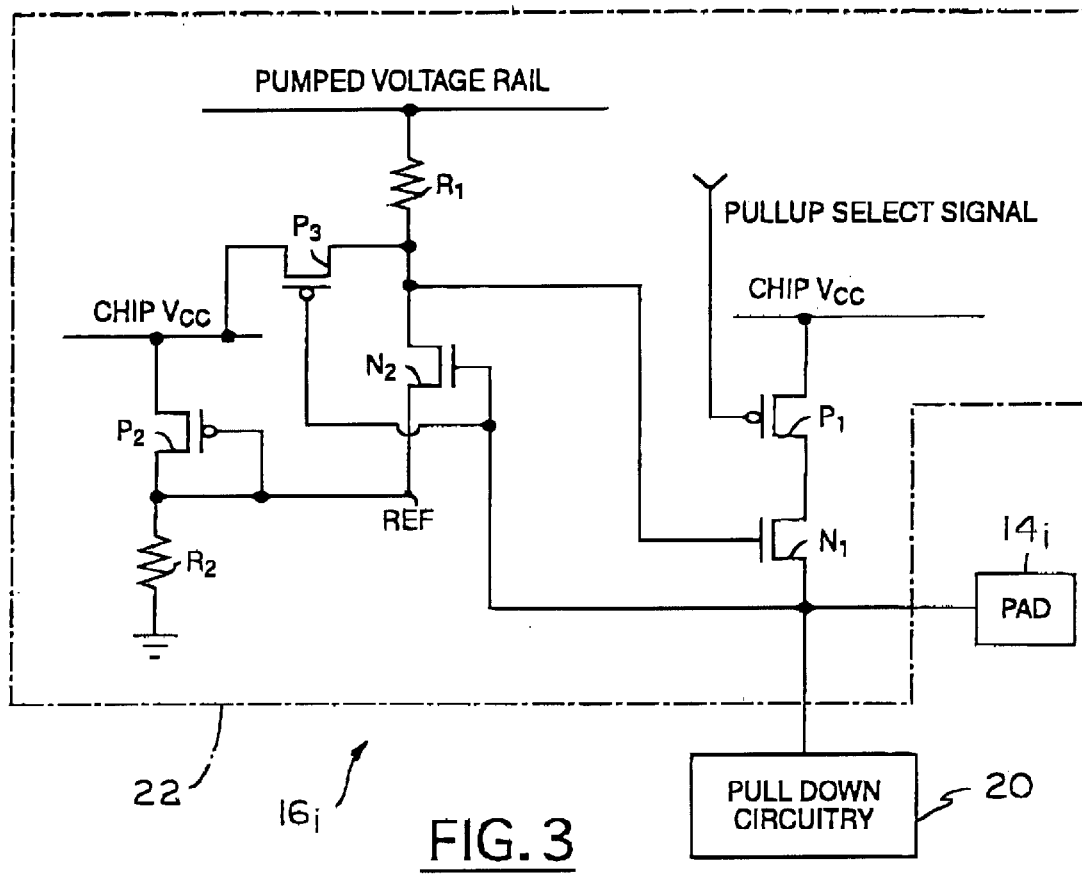
FIG. 3 is a simplified schematic and block diagram view showing, in greater detail, the pullup structure depicted in FIG. 2.

Referring now to FIG. 3, normal bias circuit 24 includes a resistive element $R_1$, a switch n-channel FET $N_2$, and p-channel FET $P_3$, while over voltage bias circuit 26 includes p-channel FET $P_2$ and resistive element $R_2$. Transistor $N_2$ has a drain terminal connected to the pumped voltage rail through resistive element $R_1$, and a source terminal connected to a reference node REF. $R_1$ is simply used to limit the current drawn from the charge pump. It could be implemented using a switched circuit to prevent current draw from the charge pump when $N_2$ turns on. The pumped voltage rail is provided, in the preferred embodiment, by an on-chip charge pump (conventional— not shown), and provides a voltage potential that is at least one device threshold above $V_{cc}$. Such charge pumps are well-known in the art.

Transistor $P_2$ and resistive element $R_2$ are provided for generating a reference signal on a node indicated at REF that is a predetermined amount lower than the operating voltage $V_{cc}$. It should be appreciated from the illustrated arrangement that transistor $P_2$ and element $R_2$ generate a reference signal on node REF that is approximately one diode drop below the operating voltage $V_{cc}$. The predetermined amount, while selected as one diode drop below $V_{cc}$ in the illustrated embodiment, must be selected so that $N_2$ turns "ON" when the pad voltage exceeds $V_{cc}$. It should be understood that transistor $N_2$ is provided for selectively switching the gate terminal of transistor $N_1$ between the reference signal appearing on node REF (which turns $N_1$ "OFF"), and the pumped voltage rail (which turns $N_1$ "ON"), according to the pad voltage. Finally, transistor $P_3$ is provided for post over-voltage recovery of the bias applied to the gate of $N_1$. In particular, when the voltage on the pad $14_i$ returns to a normal level (i.e., to a value at or below the on-chip $V_{cc}$) after an overvoltage condition thereon, $N_2$ switches "OFF" and the voltage on the gate of $N_1$ must be returned to the normal charge pumped voltage as soon as possible. Transistor $P_3$ helps hasten this process by pulling the gate of $N_1$ to $V_{cc}$ very quickly (i.e., it does part of the job).

Figure 4:
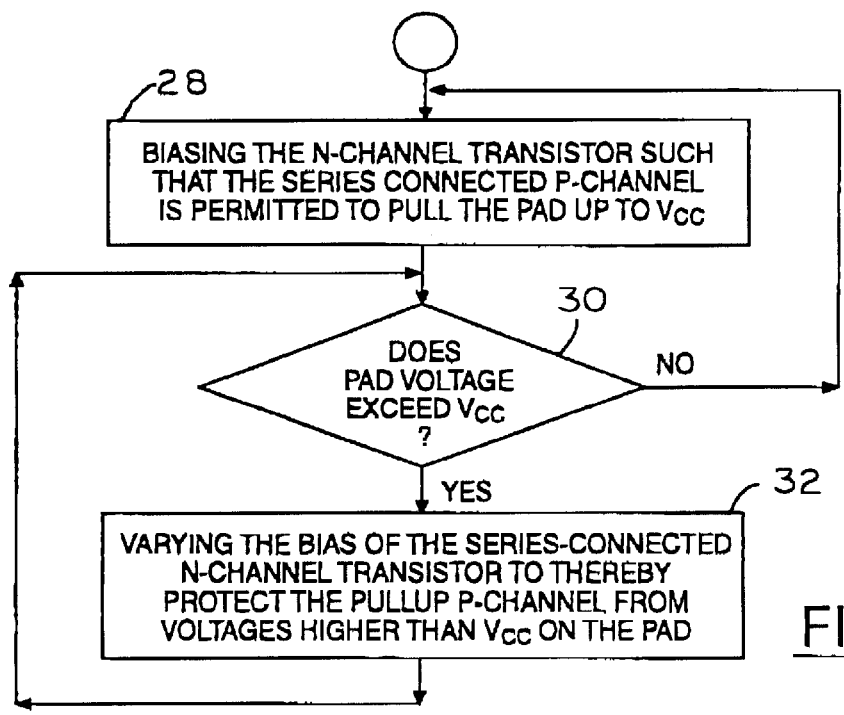
FIG. 4 is a flow-chart diagram illustrating the basic steps involved in a method of operating an I/O cell according to the present invention.

Referring now to FIG. 4, the operation of the embodiment illustrated in FIG. 3 will now be set forth in detail.

In step 28, assume initially that $N_2$ is "OFF" because the pad voltage is not higher than $V_{cc}$. Based on this assumption, the n-channel transistor $N_1$ is biased, by way of the pumped voltage appearing on the pumped voltage rail, such that pullup $P_1$ can selectively pull the pad voltage level all the way up to $V_{cc}$, depending on the state of the pullup select signal. It should be appreciated that, under these normal operating conditions where the pad voltage on pad $14_i$ is no higher than $V_{cc}$, that transistor $N_1$ is always "ON," thus eliminating the undesirable, substantial dynamic switching current of conventional designs. Thus, the current drawn from the charge pump is relatively small.

In step 30, the circuitry determines whether the pad voltage exceeds $V_{cc}$. If the pad voltage on pad $14_i$ is equal to or less than $V_{cc}$, then "normal" operation occurs as described above (i.e., step 28 is again performed). That is, the gate terminal of $N_1$ is tied to the pumped voltage rail, and $N_1$ acts as a pass gate for $V_{cc}$, as determined and controlled by $P_1$. In the alternative, when the pad voltage rises $V_{cc}$, step 32 is performed, wherein the bias applied to the series-connected transistor $N_1$ is varied so as to turn-off. That is, when the pad voltage on pad $14_i$ rises above $V_{cc}$, then transistor $N_2$ will turn "ON" since the potential appearing on node REF is, in the illustrated embodiment, a diode drop below $V_{cc}$, thus providing a sufficiently large $V_{gs}$ for transistor $N_2$ to turn-on. When transistor $N_2$ turns on, it pulls the potential on the gate terminal $N_1$ to that of the reference node REF. The reference potential on the reference node, when coupled to the gate of transistor $N_1$, causes transistor $N_1$ to shut-off because its gate-to-source voltage, $V_{gs}$, is now less than $V_T$, and may in-fact be negative. In this scenario, $N_1$ isolates $P_1$ from the excessive voltages on the pad so that, for example, the parasitic diodes of $P_1$ do not conduct excessive currents. Further, this isolation also prevents $P_1$ from turning "ON" and shorting the applied high voltage on the pad to the internal $V_{cc}$ (e.g., 3.3 volts).

When the excessive voltage is no longer applied to the pad $14_i$, $N_2$ shuts off, and $P_3$ pulls the gate of $N_1$ to $V_{cc}$. The charge pump (not shown) pulls the gate of $N_1$ the rest of the way to the "pumped" voltage sufficient to bias $N_1$ as described above (i.e., above $V_{cc}$).

Thus, transistors $P_2$, $N_2$, and resistive elements $R_1$ and $R_2$, in the illustrated arrangement, form the means for placing $N_1$ in a substantially conductive made for normal operation, and for placing $N_1$ in a substantially non-conductive mode when the pad voltage exceeds $V_{cc}$. When substantially non-conductive, $N_1$ operates to isolate and protect $P_1$ from the damaging currents described above. Resistive elements $R_1$ and $R_2$ may be implemented in many different ways, including switch circuits containing transistors.

The relative transistor sizes for transistor $P_1$, and $N_1$ may be selected in accordance with the desired application. In one embodiment, $P_1$ and $N_1$ are sized to have a total gate width of approximately 300 $\mu$m, and 400 $\mu$m, respectively, in a multi-finger configuration. Thus, in this embodiment, reasonably sized pullup devices are used to provide an embodiment suitable for use in devices where $I_{OH}$ and $V_{OH}$ are relatively small. It should be appreciated that a key feature of an embodiment in accordance with the present invention is that transistor $N_1$ is not switching dynamically, but rather, in contrast, is "ON" substantially continuously, except for those occasions when the pad voltage exceeds $V_{cc}$. The extent of the current drawn from the charge pump through resistive element $R_1$ to supply the gate of transistor $N_1$ is thus limited mainly to that needed to counteract and compensate for leakage currents in a normal range expected, based on present day fabrication techniques.

While the invention has been particularly shown and described with reference to the preferred embodiments thereof, it is well understood by those skilled in the art that various changes and modifications can be made in the invention without departing from the spirit and scope thereof, the invention being limited only by the appended claims.

I claim:

1. An interface structure connected to a pad of a semiconductor device, comprising:

a pullup p-channel transistor connected to a first power supply producing a first voltage, said p-channel transistor having a gate terminal responsive to a pullup select signal for pulling said pad high to said first voltage;

a pullup n-channel transistor connected in series between said p-channel transistor and said pad, said n-channel transistor having a gate terminal;

means for placing said n-channel transistor in a conductive state to allow said pullup p-channel transistor to selectively pull said pad to said high level when said pad voltage is substantially at or below said first voltage, and, for placing said n-channel transistor in a substantially non-conductive state when said pad voltage exceeds said first voltage to thereby protect said p-channel pullup transistor from excessive voltage potentials on said pad.

2. The interface structure of claim 1 wherein said means for placing said n-channel transistor in conductive and non-conductive states comprises:

means for generating a reference signal having a magnitude that is a predetermined amount lower than said first voltage;

switch means connected to a second power supply producing a second voltage that is greater than said first voltage, for selectively switching said gate terminal of said n-channel transistor between said reference signal, to effect said non-conductive state, and said second voltage, to effect said conductive state, according to a pad voltage level appearing on said pad.

3. The structure of claim 2 wherein said reference signal generating means includes a reference p-channel transistor having a source terminal connected to said first power supply, and a drain terminal and a gate terminal coupled to a reference node, said reference node being connected through a resistive element to a ground node, said reference signal appearing on said reference node.

4. The structure of claim 2 wherein said switch means includes a switch n-channel transistor having a gate terminal responsive to said pad voltage, a drain terminal biased by said second power supply, and a source terminal responsive to said reference signal.

5. The structure of claim 2 further comprising a pulldown circuit coupled between said pad and a ground node for pulling said pad low to a ground potential.

6. The structure of claim 2 wherein said reference signal generating means includes a reference p-channel transistor having a source terminal connected to said first power supply, and a drain terminal and a gate terminal coupled to a reference node, said reference node being connected through a first resistive element to a ground node wherein said reference signal appears on said reference node, and wherein said switch means includes a switch n-channel transistor having a gate terminal connected to said pad, a drain terminal biased by said second power supply through a second resistive element, and a source terminal connected to said reference node for receiving said reference signal, said structure further including a third p-channel transistor connected between said first power supply and said gate terminal of said pullup n-channel transistor for charging said gate terminal of said pullup n-channel transistor to said first voltage level after said excessive voltage potentials on said pad have been discontinued.

7. A device having an improved interface structure connected to a pad of the device, comprising:

a semiconductor body portion having a plurality of interface cells for interfacing with signals external to said semiconductor body wherein at least one of said plurality of interface cells includes a pullup p-channel transistor connected to a first power supply producing a first voltage, said p-channel transistor having a gate terminal responsive to a pullup signal for pulling said pad high to said first voltage;

a pullup n-channel transistor connected in series between said p-channel transistor and said pad, said n-channel transistor having a gate terminal;

a normal bias circuit connected to a second power supply producing a second voltage that is greater than said first voltage for biasing said gate terminal of said n-channel transistor with said second voltage so as to place said n-channel transistor in a substantially conductive state capable of passing said first voltage when a pad voltage is substantially at or below said first voltage; and, an over voltage bias circuit for biasing said gate terminal of said n-channel transistor so as to place said n-channel transistor in a substantially non-conductive state when said pad voltage exceeds said first voltage.

8. The device of claim 7 wherein said over voltage bias circuit includes a reference p-channel transistor having a source terminal connected to said first power supply, and a drain terminal and a gate terminal coupled to a reference node, said reference node being connected through a resistive element to a ground node, said drain terminal generating a reference signal on said reference node having a magnitude that is a predetermined amount lower than said first voltage.

9. The device of claim 8 wherein said over voltage bias circuit further includes a switch n-channel transistor having a gate terminal connected to said pad, a drain terminal biased by said second power supply, and a source terminal responsive to said reference signal.

10. The device of claim 9 wherein said drain terminal of said switch n-channel transistor is biased by said second power supply through a second resistive element wherein when said switch n-channel transistor is substantially non-conductive, said second voltage is applied to the gate of said pullup n-channel transistor to thereby allow said pullup p-channel transistor to selectively pullup said pad to said first voltage, and wherein when said switch n-channel transistor is substantially conductive, said reference signal is applied to the gate terminal of said pullup n-channel transistor to thereby turn off said pullup n-channel transistor whereby said pullup p-channel transistor is protected from excessive voltage potentials appearing on said pad.

11. The device of claim 10 further comprising a third p-channel transistor connected between said first power supply and said gate terminal of said pullup n-channel transistor, and having a gate terminal responsive to the pad voltage level for selectively charging said gate terminal of said pullup n-channel transistor to said first voltage.

12. The device of claim 7 further comprising a pulldown circuit coupled between said pad and a ground node for pulling said pad low to a ground potential.

13. In a semiconductor device having an interface structure connected to a pad wherein the interface structure includes a pullup p-channel transistor connected to a first power supply producing a first voltage, and, a pullup n-channel transistor connected in-series between the pullup p-channel transistor and the pad, a method of operating the structure comprising the steps of:

(A) biasing the pullup n-channel transistor to substantially conduct such that the pullup p-channel transistor is controllable according to a pullup select signal for selectively pulling the pad high to the first voltage; and, (B) varying said biasing step when a pad voltage level on the pad exceeds the first voltage level to place the pullup n-channel transistor in a substantially nonconductive state to thereby isolate the pullup p-channel transistor from the pad whereby the pullup p-channel is protected from undesirable currents.

14. The method of claim 13 wherein step (A) includes the substeps of:

generating a pumped voltage signal that is at least one device threshold voltage level higher than the first voltage;

applying the pumped voltage signal to a gate terminal of the n-channel transistor to thereby allow the pullup p-channel transistor to pull the pad high to a level substantially equal to the first voltage.

15. The method of claim 14 wherein said applying the pumped voltage signal step comprises the substep of:

providing a resistive element between a pumped voltage power supply and the gate terminal of the pullup n-channel transistor.

16. The method of claim 13 wherein step (B) includes the substeps of:

generating a reference voltage signal that is lower than the first voltage;

applying the reference voltage signal to a gate terminal of the pullup n-channel transistor when the pad voltage exceeds the first voltage so as to diminish the conductivity of the pullup n-channel transistor.

17. The method of claim 16 wherein said applying the reference voltage signal step comprises the substeps of:

providing a switch between the gate terminal of the pullup n-channel transistor and the reference voltage signal;

switching the reference voltage signal to the gate terminal of the pullup n-channel transistor when the pad voltage exceeds the first voltage.

* * * * *